(12) United States Patent
Yoshikawa

(10) Patent No.: US 7,551,329 B2
(45) Date of Patent: Jun. 23, 2009

(54) LED CHIP MOUNTING STRUCTURE AND IMAGE READER HAVING SAME

(75) Inventor: Yasuhiro Yoshikawa, Kyoto (JP)

(73) Assignee: Rohm Co., ltd., Kyoto (JP)

( * ) Notice: Subject to any disclaimer, the term of this patent is extended or adjusted under 35 U.S.C. 154(b) by 876 days.

(21) Appl. No.: 10/518,225

(22) PCT Filed: Jun. 20, 2003

(86) PCT No.: PCT/JP03/07901

§ 371 (c)(1),
(2), (4) Date: Dec. 16, 2004

(87) PCT Pub. No.: WO04/001863

PCT Pub. Date: Dec. 31, 2003

(65) Prior Publication Data
US 2005/0230853 A1    Oct. 20, 2005

(30) Foreign Application Priority Data
Jun. 20, 2002  (JP) ............................ 2002-180076

(51) Int. Cl.
*H04N 1/04* (2006.01)
*H01L 29/80* (2006.01)

(52) U.S. Cl. ................. 358/474; 358/482; 358/483; 257/431

(58) Field of Classification Search ............... 382/312; 358/473, 474, 475, 482, 483; 250/200, 559.06, 250/559.07, 559.08; 257/257, 433, 431, 257/432, 693, 694
See application file for complete search history.

(56) References Cited

U.S. PATENT DOCUMENTS

| | | | | |
|---|---|---|---|---|
| 3,935,501 A | * | 1/1976 | Sterbal | 313/499 |
| 5,841,128 A | * | 11/1998 | Shibuya et al. | 250/208.1 |
| 6,339,247 B1 | * | 1/2002 | Taguchi | 257/433 |
| 6,573,537 B1 | | 6/2003 | Steigerwald et al. | |
| 6,603,114 B1 | * | 8/2003 | Holzapfel et al. | 250/231.14 |
| 6,757,969 B1 | * | 7/2004 | Chan | 29/841 |
| 6,791,151 B2 | * | 9/2004 | Lin et al. | 257/434 |
| 6,835,960 B2 | * | 12/2004 | Lin et al. | 257/81 |
| 6,934,046 B1 | * | 8/2005 | Nishikawa et al. | 358/1.15 |

(Continued)

FOREIGN PATENT DOCUMENTS

EP  000889495  *  1/1999

(Continued)

OTHER PUBLICATIONS

Japanese Office Action from the corresponding JP 2002-180076, mailed Apr. 17, 2007.

(Continued)

*Primary Examiner*—Jerome Grant, II
(74) *Attorney, Agent, or Firm*—Hamre, Schumann, Mueller & Larson, P.C.

(57) ABSTRACT

An LED chip mounting structure provided by the present invention includes a wiring board with a mounting pad an LED chip with an electrode facing the mounting pad a bump disposed between the mounting pad and the electrode to electrically connect the mounting pad to the electrode and an adhesive member for fixing the LED chip to the wiring board.

17 Claims, 10 Drawing Sheets

U.S. PATENT DOCUMENTS

| | | | |
|---|---|---|---|
| 2002/0135824 A1* | 9/2002 | Saito | 358/509 |
| 2003/0089776 A1* | 5/2003 | Hennick et al. | 235/454 |
| 2003/0160995 A1* | 8/2003 | Oka et al. | 358/1.15 |

FOREIGN PATENT DOCUMENTS

| | | | |
|---|---|---|---|
| JP | 2-155257 | | 6/1990 |
| JP | 05-055635 | | 3/1993 |
| JP | 05-152605 | | 6/1993 |
| JP | 09-095011 | | 4/1997 |
| JP | 409247361 | * | 9/1997 |
| JP | 10-190960 | | 7/1998 |
| JP | 11-251645 | | 9/1999 |
| JP | 11-307818 | | 11/1999 |
| JP | 11-340281 | | 12/1999 |
| JP | 2001-119093 | | 4/2001 |
| JP | 2001-196634 | | 7/2001 |
| JP | 2001-237458 | | 8/2001 |
| JP | 2002-094123 | | 3/2002 |
| JP | 2002-094128 | | 3/2002 |

OTHER PUBLICATIONS

Japanese Office Action for the corresponding JP application 2002-180076, mailed Nov. 21, 2006.

Japanese Office Action for corresponding application 2002-180076, mailed Aug. 29, 2006.

* cited by examiner

LED CHIP MOUNTING STRUCTURE AND IMAGE READER HAVING SAME

TECHNICAL FIELD

The present invention relates to an LED chip mounting structure constituted by having an LED chip mounted on the wiring board, and an image reading device employing the same.

BACKGROUND ART

An image reading device generally comprises a light source and a light receiving portion. The light source emits light to irradiate an image-scanned region, when the reading device is operated. The light emitted from the light source is reflected at the image-scanned region of a document, which is a target of image reading. The light receiving portion receives the reflected light and outputs an image signal in accordance with the amount of light received. In such an image reading device, sometimes three light-emitting diode (LED) chips with different luminescent colors are applied as the light source. In this case, these LED chips are incorporated in the image reading device while being mounted in a predetermined wiring board.

FIG. 10A to FIG. 10C show three LED chips 60, 70 and 80 having different configurations that can construct the light source of the image reading device.

A first type of the LED chip 60 shown in FIG. 10A has a laminated structure comprising a P-type semiconductor layer 61a, N-type semiconductor layer 61b, and an active layer 61c formed therebetween. The lower surface of the laminated structure 61 in the figure is provided with an anode 62 covering substantially the whole area of the surface, and the upper surface is provided with a cathode 63 covering only a part of the upper surface. An LED chip having the configuration of the first type LED chip 60, for example, is employed as a red LED chip for the light source. When a predetermined voltage is applied through the anode 62 and cathode 63, light is emitted from the LED chip 60 via an exposed surface of the laminated structure 61.

A second type of the LED chip 70 shown in FIG. 10B has a laminated structure 71 and a transparent substrate 72. The laminated structure 71 comprises a P-type semiconductor layer 71a, N-type semiconductor layer 71b, and an active layer 71c formed therebetween. The transparent substrate 72 comprises a square-shaped portion and a frustum portion therebelow. On the lower surface of the laminated structure 71 is provided with an anode 73 covering substantially the whole area of the lower surface, and the upper surface 72a of the transparent substrate 72 is provided with a cathode 74 covering only a part of the upper surface. An LED chip having the configuration of the second type LED chip 70, for example, is employed as green and blue LED chips for the light source. When a predetermined voltage is applied through the anode 73 and cathode 74, light is emitted from the LED chip 70 via the upper surface 72a and inclined surfaces 72b of the transparent substrate 72 and via the side surfaces of the laminated structure 71.

A third type of the LED chip shown in FIG. 10C has a laminated structure 81 and a transparent substrate 82. The laminated structure 81 comprises a P-type semiconductor layer 81a, N-type semiconductor layer 81b, and an active layer 81c formed therebetween, and has a cutout portion 83. The P-type semiconductor layer 81a exposed to the cutout portion 83 is provided with an anode 84, and the lower surface of the N-type semiconductor layer 81b is provided with a cathode 85. An LED chip having the configuration of the third type LED chip 80 is sometimes employed as a blue LED chip for the light source. When a predetermined voltage is applied through the anode 84 and the cathode 85, light is emitted from the LED chip 80 via the upper surface of the transparent substrate 82 in the figure and via a predetermined side surface of the laminated structure 81.

FIG. 11 shows an example of a conventional mounting pattern of the wiring board of the LED chip for the light source in the image reading device. In the mounting pattern shown in FIG. 11, three LED chips 92R, 92G and 92B as the light source are mounted on a wiring board 91.

The LED chip 92R is a red light source and has the configuration of the abovementioned first type LED chip 60. The LED chip 92G is a green light source and has the configuration of the second type LED chip 70. The LED chip 92B is a blue light source and has the configuration of the second type LED chip 70.

Further, a plurality of photoelectric converters 93 as the light receiving portion, which are arranged in a line, are loaded on the wiring board 91. The wiring board 91 also has a wiring pattern 94 for configuring a circuit along with the LED chips 92R, 92G, 92B and the photoelectric converters 93. A predetermined place on the wiring pattern 94 is provided with three mounting pads 95 that are provided with respect to the LED chips 92R, 92G and 92B respectively, and with a connection pad 96, the LED chips 92R, 92G and 92B being loaded on the corresponding mounting pads 95.

FIG. 12A shows a conventional mounting structure of the wiring board 91 of the LED chip 92R, that is, the first type LED chip 60. When mounting the LED chip 60 on the wiring board 91, first, a chip bonder, for example, is used to press the LED chip 60 onto the mounting pad 95 by means of a solder or a conductive paste under a predetermined temperature condition, to join the anode 62 and mounting pad 95 of the LED chip 60 together via an adhesive metal portion 97 obtained originally from the solder or conductive paste. Next, by means of a wire bonding technology, the cathode 63 is electrically connected to the connection pad 96 via a wire W. In FIG. 12A, however, the adhesive metal portion 97 is not shown between the anode and mounting pad, for the purpose of simplification. The same thing can hold for FIG. 12B.

FIG. 12B shows a conventional mounting structure of the wiring board 91 of the LED chips 92G and 92B, that is, the second type LED chip 70. When mounting the LED chip 70 on the wiring board 91, first, the chip bonder, for example, is used to press the LED chip 70 onto the mounting pad 95 by means of the solder or conductive paste under a predetermined temperature condition, to join the anode 73 and mounting pad 95 of the LED chip 70 together via the adhesive metal portion 97 obtained originally from the solder or conductive paste. Next, by means of the wire bonding technology, the cathode 74 is electrically connected to the connection pad 96 via the wire W. In this manner, the LED chip 70 is mounted through the same steps as with the LED chip 60.

In the conventional mounting structure of the LED chip 60, the amount of the solder or conductive paste running over between the anode 62 and the mounting pad 95 in the mounting process is relatively large, thus, as shown in FIG. 12A, the adhesive metal portion 97 sometimes covers the side surfaces of the laminated structure 61 up to relatively high point of the surfaces. When applying a voltage to the LED chip 60, leak current easily runs through the place on the side surface that is covered by the adhesive metal portion 97, thus generation of the leak current causes a decrease in luminous efficiency or luminance of the LED chip 60. In addition, the fact that the adhesive metal portion 97 covers the side surfaces partially is also a cause of low luminance. In particular, when the adhesive metal portion 97 covers the side surfaces up to a point higher than the active layer 61$c$, the extent of the decrease in luminance is significant.

In the conventional mounting structure of the LED chip 70, the amount of the solder or conductive paste running over between the anode 73 and the mounting pad 95 in the mounting process is relatively large, thus, as shown in FIG. 12B, the adhesive metal portion 97 sometimes covers the side surfaces of the laminated structure 71 and a part of the inclined surfaces 72$b$ of the transparent substrate 72. In the LED chip 70, the P-type semiconductor layer 71$a$ is so thin that the active layer 71$c$ is close to the mounting pad 95, thus a place involved in the side surface of the active layer 71$c$ is completely and easily covered by the adhesive metal portion 97. When applying a voltage to the LED chip 70, leak current easily runs through the places on the side surface and the inclined surface 72$b$ that are covered by the adhesive metal portion 97, thus generation of the leak current causes a decease in luminous efficiency or luminance of the LED chip 70. In addition, when the adhesive metal portion 97 covers the place involved in the side surface of the active layer 71$c$, it causes a significant decrease in luminance. Furthermore, the fact that the adhesive metal portion 97 partially covers the inclined surfaces 72$b$ is also a cause of the low luminance.

FIG. 12C shows a conventional mounting structure when employing the third type LED chip 80 as the blue LED chip, instead of the second type LED chip 70. In order to mount the LED chip 80, instead of the mounting pad 95 and the connection pad 96 that are electrically connected to both electrodes of the LED chip 70, a wiring board 91' on which different mounting pad 95' and connection pad 96' are formed.

When mounting the LED chip 80 on such a wiring board 91', first, for example, the LED chip 80 is disposed on the wiring board 91', such that the anode 84 of the LED chip 80 abuts on the mounting pad 95' while the cathode 85 abuts on a part of the connection pad 96'. Next, an insulating resin adhesive 98 is filled between the LED chip 80 and the wiring board 91'. A solder or conductive paste cannot be used instead of the insulating resin adhesive 98 as a means to fix the LED chip 80 to the wiring board 91'. This is because if the solder or conductive paste is melted once and then solidified between the wiring board 91' and LED chip 80, the anode 84 and cathode 85 short. Therefore, from a practical perspective, it is necessary to mount the third type LED chip 80 on the wiring board 91' by means of a different method in which a material that is different from the first and second type LED chips 60 and 70 is used.

In the conventional mounting structure of the LED chip 80, the side surfaces of the laminated structure 81 are covered by the insulating resin adhesive 98, as shown in FIG. 12C. If the insulating resin adhesive 98 is fed between the LED chip 80 and wiring board 91' at an amount sufficient to appropriately fix the LED chip 80 to the wiring board 91' in the mounting process, a part of the insulating resin adhesive 98 runs over between the LED chip 80 and the wiring board 91' and goes up the side surface of the laminated structure 81. The laminated structure 81 of the LED chip 80 is relatively thin, thus the part of the insulating resin adhesive 98 ends up covering the side surfaces of the laminated structure 81. Covering the side surfaces of the laminated structure 81 with the insulating resin adhesive 98 causes a decrease in luminance.

Moreover, when employing the third type LED chip 80 as the blue LED chip in the image reading device, instead of the second type LED chip 70, the conventional technology ends up causing an increase in the manufacturing man-hour and complicating the manufacturing line. This is because, in addition to the types of steps for mounting the LED chip 92R (the first type LED chip 60) and the LED chip 92G (the second type LED chip 70), a type of steps for mounting the blue LED chip (the third type LED chip 80) has to be performed, the type of steps being different from the above type of steps.

In addition, when employing the third type LED chip 80 as the blue LED chip in the image reading device, instead of the second type LED chip 70, in the conventional technology the wiring board 91' instead of the wiring board 91 has to be prepared, the wiring board 91' being different from the wiring board 91. Therefore, in a single manufacturing line of the image reading device, when employing both LED chips 70 and 80 as the blue LED chip, the wiring boards 91 and 91' corresponding to the type of the LED chips are necessary, according to the conventional technology. This is not preferred in terms of the production cost and the management cost.

DISCLOSURE OF THE INVENTION

The present invention has been proposed under the circumstances described above. It is therefore an object of the present invention to provide an LED chip mounting structure that is suitable for preventing luminance of an LED chip from being decreased, and that is rich in types of applicable LED chips, and to provide an image reading device comprising this structure.

According to a first aspect of the present invention, an LED chip mounting structure is provided. This mounting structure comprises: a wiring board provided with a mounting pad; an LED chip provided with an electrode facing the mounting pad; a bump disposed between the mounting pad and the electrode for electrically connecting the mounting pad and the electrode to each other; and an adhesive member for fixing the LED chip to the wiring board.

In a preferred embodiment of the first aspect of the present invention, the adhesive member comprises an anisotropic conductive resin composite. In this case, preferably the bump is fusion-welded to the mounting pad, and is electrically connected to the electrode by the anisotropic conductive resin composite.

In another preferred embodiment, the adhesive member comprises an insulating resin composite. In this case, preferably the bump is fusion-welded to the mounting pad, and directly abuts on the electrode without having the insulating resin composite therebetween.

In the first aspect of the present invention, preferably the LED chip is further provided with an electrode that is opposite to the wiring board.

According to a second aspect of the present invention, another LED chip mounting structure is provided. This mounting structure comprises: a wiring board provided with a first and a second mounting pads; an LED chip provided with a first electrode facing the first mounting pad, and with a second electrode facing the second mounting pad; a first bump disposed between the first mounting pad and the first electrode for electrically connecting the first mounting pad and the first electrode to each other; a second bump disposed between the second mounting pad and the second electrode for electrically connecting the second mounting pad and the second electrode to each other; and an adhesive member for fixing the LED chip to the wiring board.

In a preferred embodiment of the second aspect of the present invention, the adhesive member comprises an anisotropic conductive resin composite. In this case, the first bump is fusion-welded to the first mounting pad, and is electrically connected to the first electrode by the anisotropic conductive resin composite. The second bump is fusion-welded to the second mounting pad, and is electrically connected to the second electrode by the anisotropic conductive resin composite.

In another preferred embodiment, the adhesive member comprises an insulating resin composite. In this case, the first bump is fusion-welded to the first mounting pad, and directly abuts on the first electrode without having the insulating resin composite therebetween. The second bump is fusion-welded to the second mounting pad, and directly abuts on the second electrode without having the insulating resin composite therebetween.

According to a third aspect of the present invention, another LED chip mounting structure is provided. This mounting structure comprises: a wiring board provided with at least three mounting pads; an LED chip provided with an electrode facing first and second mounting pads that are selected from among the above-mentioned at least three mounting pads; a first bump disposed between the first mounting pad and the electrode for electrically connecting the first mounting pad and the electrode to each other; a second bump disposed between the second mounting pad and the electrode for electrically connecting the second mounting pad and the electrode to each other; and an adhesive member for fixing the LED chip to the wiring board.

In a preferred embodiment of the third aspect of the present invention, the adhesive member comprises an anisotropic conductive resin composite. In this case, the first bump is fusion-welded to the first mounting pad, and is electrically connected to the electrode by the anisotropic conductive resin composite. The second bump is fusion-welded to the second mounting pad, and is electrically connected to the electrode by the anisotropic conductive resin composite.

In another preferred embodiment, the adhesive member comprises an insulating resin composite. In this case, the first bump is fusion-welded to the first mounting pad, and directly abuts on the electrode without having the insulating resin composite therebetween. The second bump is fusion-welded to the second mounting pad, and directly abuts on the electrode without having the insulating resin composite therebetween.

According to a fourth aspect of the present invention, another LED chip mounting structure is provided. This mounting structure comprises: a wiring board provided with at least three mounting pads; an LED chip provided with a first electrode facing a first mounting pad selected from among the above-mentioned at least three mounting pads and with a second electrode facing a second mounting pad selected from among the above-mentioned at least three mounting pads; a first bump disposed between the first mounting pad and the first electrode for electrically connecting the first mounting pad and the first electrode to each other; a second bump disposed between the second mounting pad and the second electrode for electrically connecting the second mounting pad and the second electrode to each other; and an adhesive member for fixing the LED chip to the wiring board.

In a preferred embodiment of the fourth aspect of the present invention, the adhesive member comprises an anisotropic conductive resin composite. In this case, the first bump is fusion-welded to the first mounting pad, and is electrically connected to the first electrode by the anisotropic conductive resin composite. The second bump is fusion-welded to the second mounting pad, and is electrically connected to the second electrode by the anisotropic conductive resin composite.

In another preferred embodiment, the adhesive member comprises an insulating resin composite. In this case, the first bump is fusion-welded to the first mounting pad, and directly abuts on the first electrode without having the insulating resin composite therebetween. The second bump is fusion-welded to the second mounting pad, and directly abuts on the second electrode without having the insulating resin composite therebetween.

According to a fifth aspect of the present invention, an image reading device is provided. This device comprises: an LED chip for emitting light to irradiate an image-scanned region of a document; a wiring board on which the chip is mounted; and a light receiving portion for receiving light which is emitted from the LED chip and reflected on the image-scanned region, the light receiving portion being designed to output an image signal corresponding to the amount of light received. The wiring board is provided with a mounting pad. The LED chip has an electrode opposed to the mounting pad. A bump is disposed between the mounting pad and the electrode for electrically connecting the mounting pad and the electrode to each other. The wiring board and the LED chip are fixed to each other by an adhesive member.

BEST MODE FOR CARRYING OUT THE INVENTION

Figure 1:
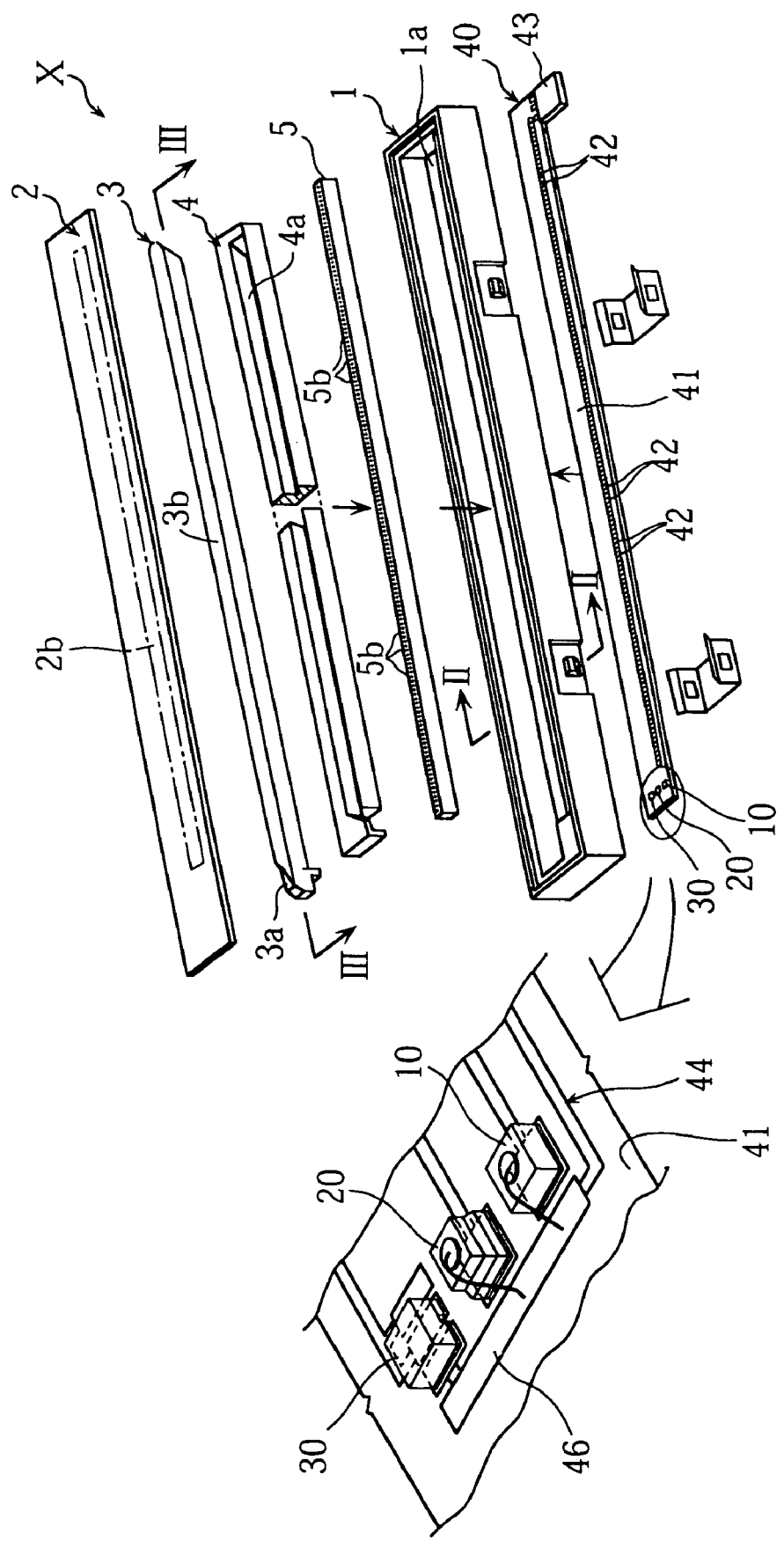
FIG. 1 is an exploded perspective view of an image reading device according to the present invention.
Figure 2:
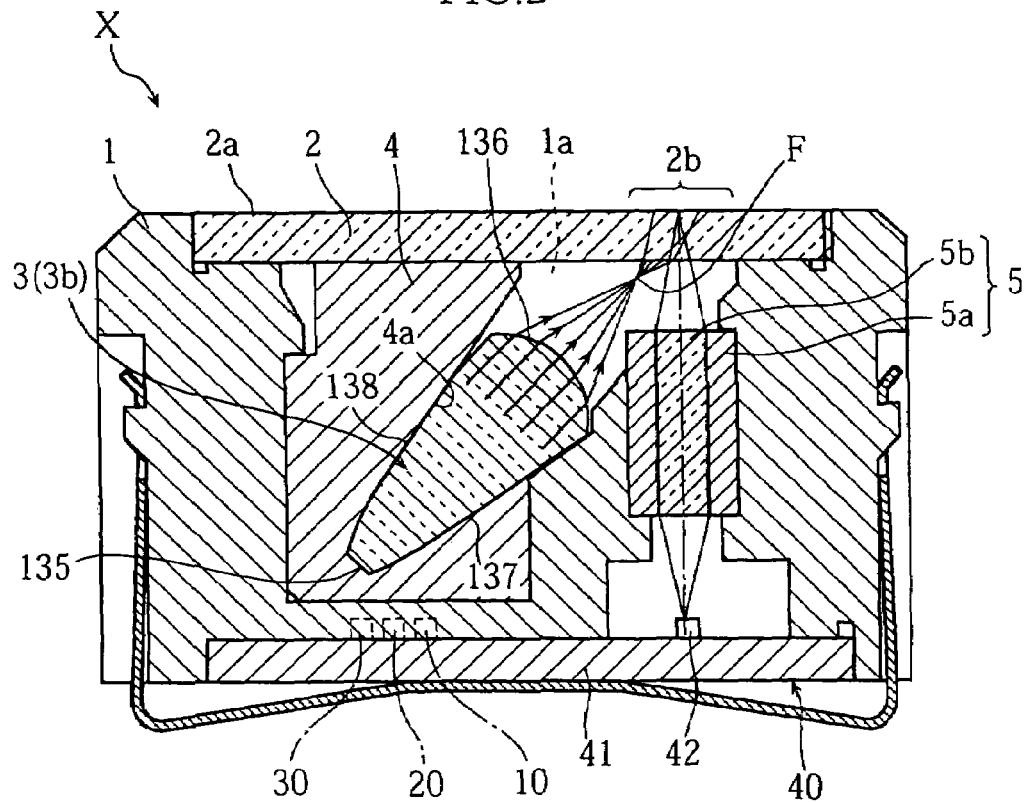
FIG. 2 is an enlarged cross-sectional view taken along the line II-II on the image reading device of FIG. 1 in an assembled state.

FIG. 1 is an exploded perspective view of an image reading device X according to the present invention. FIG. 2 is an enlarged cross-sectional view taken along the line II-II shown in the image reading device X of FIG. 1 in an assembled state. The image reading device X comprises a case 1, a circuit board 40, a transparent plate 2, a light guide 3, a reflector 4, and a lens array 5.

The case 1 is formed into an elongated shape by a synthetic resin or the like to have a predetermined receiving space 1a.

The above-mentioned components constituting the image reading device X are set in the case 1.

The circuit board 40 comprises a wiring board 41, three LED chips 10, 20 and 30, and a plurality of photoelectric converters 42 that are arranged in a line, where an LED chip mounting structure, as will be described hereinafter, is applied for mounting the LED chips 10, 20 and 30 onto the wiring board 41.

The wiring board 41 is installed in a bottom surface portion of the case 1, as shown in FIG. 2, and the main body of the wiring board is an insulating substrate constituted by, for example, an alumina ceramic or the like. As shown in FIG. 1, on the surface of the wiring board 41, there is formed a wiring pattern 44 for feeding electric power or for inputting/outputting various signals to each of the LED chips 10, 20 and 30, and to each of the photoelectric converters 42, and also a connector 43 connected electrically to the wiring pattern 44 is attached.

The transparent plate 2 is formed into a strip-like shape by a transparent glass or resin. Such a transparent plate 2 is installed in the case 1 so as to block an upper opening of the receiving space 1a. In use of the image reading device, an object to be scanned is disposed so as to face an upper surface 2a of the transparent plate 2 and is moved in the secondary scanning direction (lateral direction in FIG. 2). In the upper surface 2a of the transparent plate 2, the section right above the lens array 5 is an image-scanned region 2b. The image-scanned region 2b linearly extends in a longitudinal direction of the case 1 or the transparent plate 2.

The LED chips 10, 20 and 30 function as a light source of the image reading device X. The LED chip 10 is an LED chip that emits red light, and is same as the first type LED chip 60 described above in terms of, at least, the external configuration, thus it belongs to the first type LED chip 60. The LED chip 20 is an LED chip that emits green light, and is same as the second type LED chip 70 described above in terms of, at least, the external configuration, thus it belongs to the second type LED chip 70. The LED chip 30 is an LED chip that emits blue light, and is same as the third type LED chip 80 described above in terms of, at least, the external configuration, thus it belongs to the third type LED chip 80.

The LED chips 10, 20 and 30 are used individually in the present embodiment, and, as shown in FIG. 1, are mounted on an end portion of the wiring board 41 so as to be aligned in the width direction of the wiring board 41.

Figure 4A:
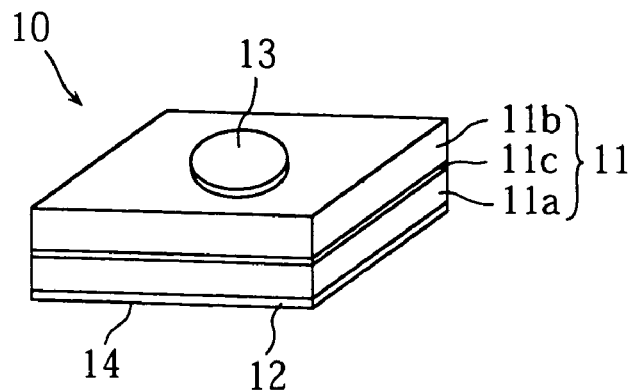
FIG. 4A to FIG. 4C are schematic perspective views of an LED chip for light source, which is used in the present invention.
Figure 4B:
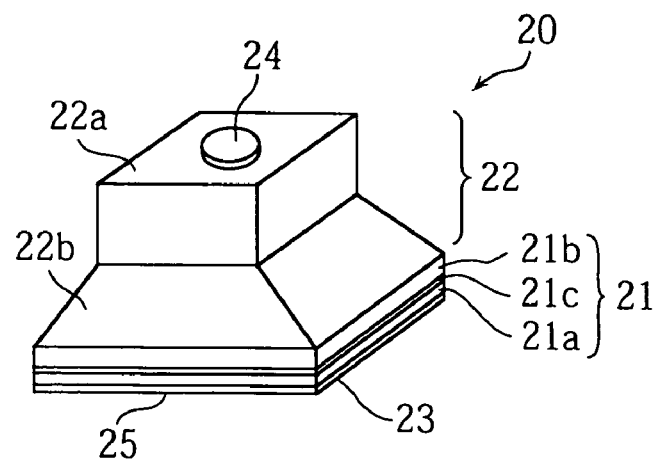
Figure 4C:
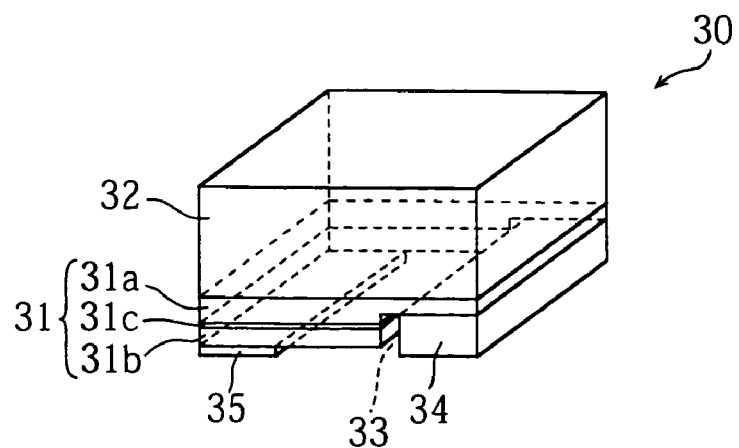

The LED chip 10 has, as shown in FIG. 4A, a laminated structure 11 comprising a P-type semiconductor layer 11a, an N-type semiconductor layer 11b, and an active layer 11c formed therebetween. The P-type semiconductor layer 11a, N-type semiconductor layer 11b, and active layer 11c are respectively made from predetermined materials. The lower surface of the laminated structure 11 in the figure is provided with an anode 12 covering substantially the whole area of the lower surface, and the upper surface is provided with a cathode 13 covering only a part of the upper surface. The lower face of the anode 12 serves as a joint surface 14 to face the wiring board when the LED chip 20 is mounted on the wiring board. When a predetermined voltage is applied through the anode 12 and cathode 13, light is emitted from the LED chip 10 via an exposed surface of the laminated structure 11.

The LED chip 20 has a laminated structure 21 and a transparent substrate 22. The laminated structure 21 comprises a P-type semiconductor layer 21a, N-type semiconductor layer 21b, and active layer 21c formed therebetween. The semiconductor layers 21a and 22b are respectively made from, for example, GaN or the like doped with predetermined impurities, and the active layer 21c is made from, for example, InGaN or the like. The transparent substrate 22 is formed and shaped from a transparent crystal substrate made from SiC or the like, comprises a square-shaped portion and a frustum portion therebelow, and has an upper surface 22a and inclined surfaces 22b at the square-shaped portion and frustum portion. The laminated structure 21 is formed on the transparent substrate 22 by means of the epitaxial growth method, and is joined to the transparent substrate 22 on the N-type semiconductor layer 21b side. The lower surface of the laminated structure 21 in the figure is provided with an anode 23 covering substantially the whole area of the lower surface. The upper surface 22a of the transparent substrate 22 is provided with a cathode 24 covering only a part of the upper surface. The lower face of the anode 23 in the figure serves as a joint surface 25 to face the wiring board when the LED chip 20 is mounted on the wiring board. When a predetermined voltage is applied through the anode 23 and cathode 24, light is emitted from the LED chip 20 via the upper surface 22a and inclined surfaces 22b of the transparent substrate 22, or via the side surfaces of the laminated structure 21. On the inclined surfaces 22b, light is emitted while being refracted upward.

The LED chip 30 has a laminated structure 31 and a transparent substrate 32. The laminated structure 31 comprises a P-type semiconductor layer 31a, an N-type semiconductor layer 31b, and an active layer 31c formed therebetween, and has a cutout portion 33. The P-type semiconductor layer 31a, N-type semiconductor layer 31b and active layer 31c are respectively made from predetermined materials. The transparent substrate 32 is made from sapphire, for example. The P-type semiconductor layer 31a, active layer 31c and N-type semiconductor layer 31b are formed sequentially on the transparent substrate 32 by means of, for example, the epitaxial growth method. The P-type semiconductor layer 31a exposed to the cutout portion 33 is provided with an anode 34, and the lower surface of the N-type semiconductor layer 31b in the figure is provided with a cathode 35. The anode 34 is relatively thick, and the lower surface thereof comes to substantially the same level as the lower surface of the cathode 35. When a predetermined voltage is applied through the anode 34 and cathode 35, light is emitted from the LED chip 30 via the upper surface of the transparent substrate 32 in the figure or via a predetermined side surface of the laminated structure 31.

The plurality of photoelectric converters 42 mounted on the wiring board 41 are for receiving, via the lens array 5, light emitted from the LED chip 2 and reflected from the image-scanned region 2b and for outputting an image signal corresponding to the amount of light received.

The light guide 3 is for efficiently guiding light emitted from the LED chips 10, 20 and 30, to all over the image-scanned region 2b, and has an auxiliary region 3a, which is an end portion in the longitudinal direction, and a main region 3b other than the auxiliary region. Such a light guide 3 is made from a material having high transparency, such as PMMA, for example.

The auxiliary region 3a is an area playing a role of allowing light emitted from the LED chips 10, 20 and 30 to proceed into the main region 3b. The auxiliary region 3a has a bottom surface 131 facing downward, end surface 132A, and reflection surfaces 133 and 134. Light emitted from the LED chips 10, 20 and 30 is transmitted through the bottom surface 131, enters the auxiliary region 3a, is thereafter reflected on the reflection surfaces 133 and 134 and guided to the main region 3b.

Figure 3:
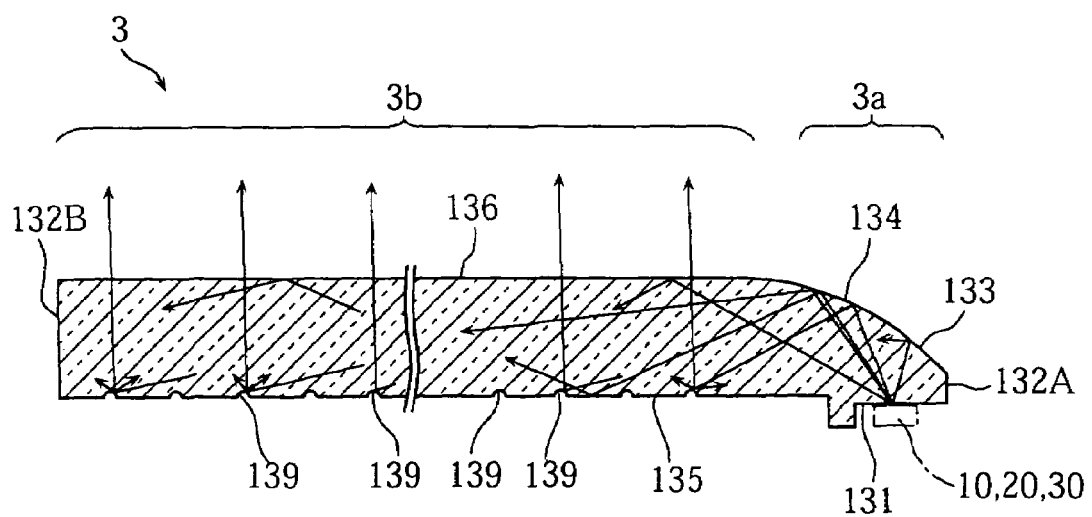
FIG. 3 is a cross-sectional view taking along the line III-III on a light guide shown in FIG. 1.

The main region 3b is an area allowing the light proceeding from the auxiliary region 3a to proceed in the longitudinal direction of the light guide 3 and at the same time guiding it to the image-scanned region 2b. The main region 3b is made substantially uniform at the cross-sectional shape thereof in each section in the longitudinal direction, and has a first surface 135 and second surface 136 opposed to the thickness direction of the light guide 3, and a third surface 137 and fourth surface 138 opposed to the width direction of the light guide 3, as shown in FIG. 2 and FIG. 3. These surfaces 135, 136, 137 and 138 extend in the longitudinal direction of the light guide 3. The first surface 135 is provided with a plurality of depressed portions 139 in the longitudinal direction, with decent spaces therebetween. Such a main region 3b is constituted such that the light proceeding from the auxiliary region 3a proceeds in a manner which will be described hereinafter.

The light proceeding from the auxiliary region 3a basically proceeds towards an end surface 132B, which is another end surface in the longitudinal direction of the light guide 3, as the light repeats total reflection at various parts other than the depressed portions 139 on the first surface 135, as well as at various parts on the second to fourth surfaces 136, 137 and 138. At the depressed portions 139, the light is scattered and reflected in different directions, and its path is changed drastically. Much of the light scattered and reflected on the depressed portions 139 is totally reflected on the third surface 137 and fourth surface 138, and falls on the second surface 136 at an angle smaller than the critical angle of the total reflection. The light that fell on the second surface 136 then exits from the second surface 136 to the outside, is focused on a predetermined focal point F, and thereafter proceeds towards the image-scanned region 2b. Such exit of the light occurs all over the second surface 136. However, the LED chips 10, 20 and 30 properly function as the light source of the image reading device X, even if the mounting places of the LED chips are proximate to the edge.

The reflector 4 is for supporting the light guide 3. The reflector 4 has a groove portion 4a into which the light guide 3 can fit, and is fitted into the receiving space la of the case 1. The groove portion 4a is brought into counter-contact with the parts other than the depressed portions 139 on the first surface 135 of the light guide 3, the third surface 137, fourth surface 138, and end faces 132A and 132B. Such reflector 4 is formed by, for example, a synthetic resin, and the faces thereof that counter-contact with at least the light guide 3 are painted in white, which has high optical reflectance. Therefore, the light proceeding into the light guide 3 is appropriately prevented from leaking out of the surfaces other than the second surface 136.

The lens array 5 is for focusing the light on the surface of the photoelectric converter 42, the light exiting from the second surface 136 of the light guide 3 and being reflected by the object to be scanned in the image-scanned region 2b. The lens array 5 comprises a holder 5a having an elongated block-like shape formed with, for example, a resin or the like, and a plurality of lenses 5b that are held by the holder, the plurality of lenses 5b being arranged in a row. A SELFOC lens is employed as the lens 5b, the SELFOC lens being capable of imaging a pictorial image, characters, symbols etc written on the object to be scanned, so as to provide an erected image at the same magnification. Such a lens array 5 is held in the case 1 so as to face the back face of the transparent plate 2.

The LED chip mounting structure employed in the image reading device X will now be described below.

Figure 5:
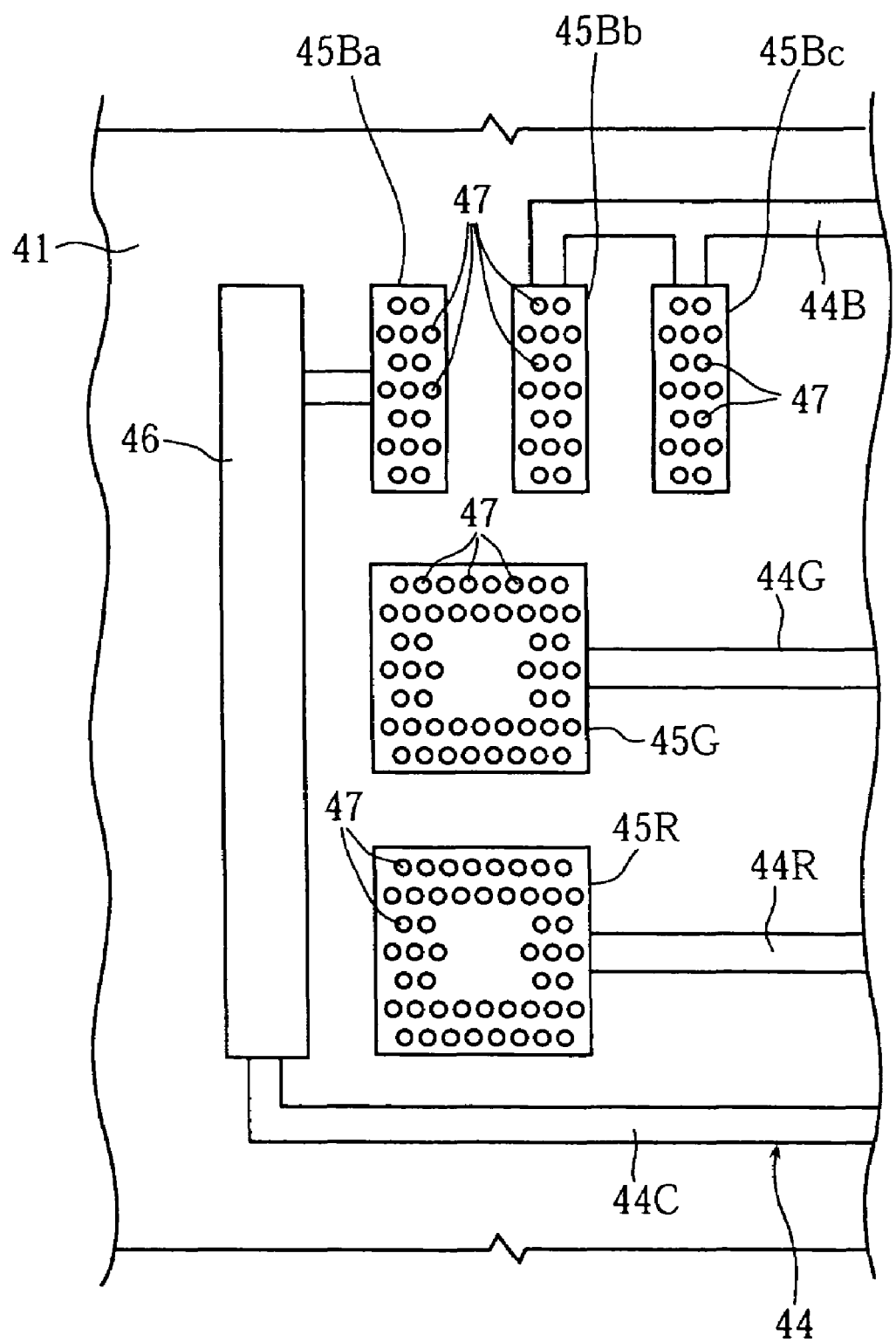
FIG. 5 is an enlarged plan view of an essential part of a wiring board shown in FIG. 1.

The wiring pattern 44 provided in the wiring board 41 is formed by patterning a conductive film such as a copper. Mounting pads 45R, 45G, 45Ba, 45Bb, 45Bc, and a connection pad 46 are provided in predetermined places of the wiring pattern 44, as shown in FIG. 1 and FIG. 5. The mounting pads 45R, 45G, 45Ba, 45Bb, 45Bc, and the connection pad 46 are formed by, for example, plating the wiring pattern 44 with gold.

The mounting pad 45R essentially is to provide a place for loading the red LED chip 10, and is provided at the end of a portion 44R, that is to be electrically connected to the anode 12 of the LED chip 10 in the wiring pattern 44. The area of the mounting pad 45R is equal to or larger than the area of the anode 12 of the LED chip 10. As shown in FIG. 5, the mounting pad 45R is provided with a plurality of bumps 47 standing up on the surface of the mounting pad.

The mounting pad 45G essentially is to provide a place for loading the green LED chip 20, and is provided at the end of a portion 44G, that is to be electrically connected to the anode 23 of the LED chip 20 in the wiring pattern 44. The area of the mounting pad 45G is equal to or larger than the area of the anode 23 of the LED chip 20. As shown in FIG. 5, the mounting pad 45G is provided with the plurality of bumps 47 standing up on the surface of the mounting pad.

The pair of mounting pads 45Ba and 45Bb essentially are to provide a place for loading the blue LED chip 30. The mounting pad 45Ba diverges from the connection pad 46 but is electrically connected to the connection pad 46, and has the area equal to or larger than the area of the cathode 35 of the LED chip 30. The connection pad 46 is provided at the end of a portion 44C, which is to be electrically connected to the cathode of each LED chip in the wiring pattern 44. The mounting pad 45Bb is provided at the end of a portion 44B, that is to be electrically connected to the anode 34 of the LED chip 30 in the wiring pattern 44, and has the area equal to or larger than the area of the anode 34 of the LED chip 30. The mounting pad 45Bb is placed at a certain distance apart with respect to the mounting pad 45Ba in the longitudinal direction of the wiring board 41. As shown in FIG. 5, the mounting pads 45Ba and 45Bb are respectively provided with the plurality of bumps 47 standing up on the surfaces of the mounting pads.

In the present embodiment, the second type blue LED chip 70 can be employed as the blue light source, instead of the LED chip 30. In such a case the pair of mounting pads 45Bb and 45Bc are for providing a place for loading the second type blue LED chip 70. The mounting pad 45Bc is provided at the end of the portion 44B of the wiring pattern 44, and is placed at a certain distance apart with respect to the mounting pad 45Bb in the longitudinal direction of the wiring board 41. The sum of the areas of the mounting pads 45Bb and 45Bc and the area of the region covering the space between these pads is equal to or larger than the area of the anode 23 of the LED chip 70. As shown in FIG. 5, the mounting pad 45Bc is provided with the plurality of bumps 47 standing up on the surface of the mounting pad 45Bc.

Figure 6:
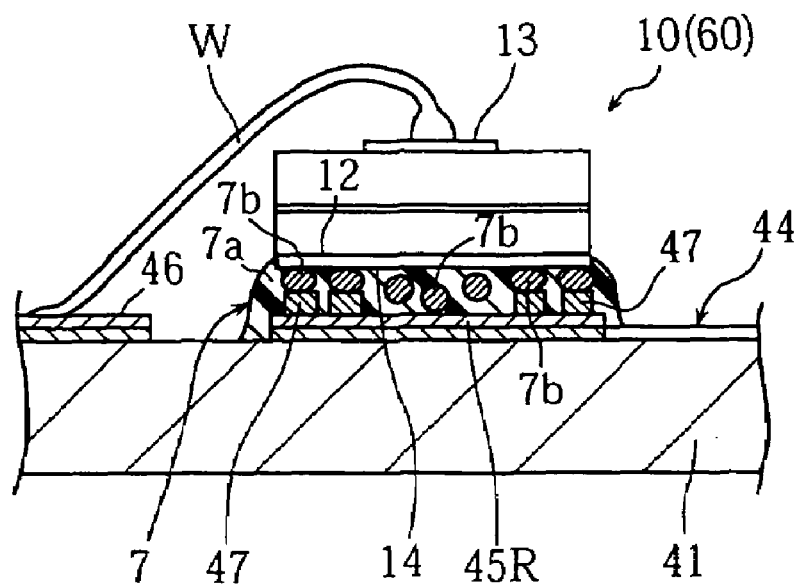
FIG. 6 shows an example of an LED chip mounting structure according to the present invention.

The FIG. 6 shows an example of the LED chip mounting structure according to the present invention, with respect to the LED chip 10 and the wiring board 41. When mounting the LED chip 10 on the wiring board 41, first of all the wiring board 41 in which the plurality of bumps 47 are already formed on the mounting pads 45Ba, 45Bb and 45Bc is prepared. The plurality of bumps 47 are formed as their heights from the board surface are adjusted so as to be equal. Consequently, when forming the pads 45R, 45G, 45Ba 45Bb and 45Bc on the wiring board 41, even when irregularities are formed on the surfaces of these mounting pads, a predetermined electrode abuts uniformly on each of the bumps 47 in the case of loading the chip, which will be described hereinafter. As a result, the LED chip 10 is appropriately prevented from being mounted obliquely or being connected poorly. The height of the each bump 47 is set such that the space between the LED chip 10 and the wiring board 41 becomes equal to or somewhat smaller than the thickness of an anisotropic conductive resin 7 described hereinafter, when loading the LED chip 10 on the wiring board 41. Such bumps 47 can be formed with gold by means of a stud bump method. In this method, first, a tip end portion of a gold wire inserted into a jig called "capillary" is projected from the tip end portion of the capillary to form a gold ball by heat melting the tip end of the gold wire with hydrogen flame or the like. The gold ball is then pressed and firmly fixed to a target mounting pad by the tip end portion of the capillary. After the gold ball is firmly fixed to the pad, the gold wire is cut off by sliding the capillary or by an external force. Accordingly, the bumps 47 are formed. Instead of using such a technique, in the present invention, a technique in which a metal such as gold is plated to obtain a thick film may be employed when forming the bumps 47.

In the mounting process of the LED chip 10, it is preferred that the bumps 47 be formed for the wiring board 41 as described above, rather than forming for the LED chip 10 or the LED chips 20 and 30 in advance.

The LED chips 10, 20 and 30 for light source that are to be incorporated in the image reading device X have a size of approximately 200 to 300 μm, which is relatively small. Therefore, forming the bumps 47 in the LED chips 10, 20 and 30 causes a decrease in the productivity due to the difficulty of holding the LED chips 10, 20 and 30. Further, the LED chips 10, 20 and 30 are respectively obtained by cutting off a wafer, which is an aggregate of plurality of LED chips; however, when creating each of the LED chips after forming the bumps 47 in the wafer, a burr or cracks tend to be easily generated on each LED chip, and moreover it is difficult to cut off to obtain such a complex shape as the second type LED chip 70.

In mounting the LED chip 10, next the anisotropic conductive resin 7 is fed onto the wiring board 41 so as to cover the mounting pad 45R. The anisotropic conductive resin 7 consists of an adhesive resin component 7a having insulation properties, and conductive particles 7b scattered inside of the resin component. A thermosetting resin, UV curable resin or the like, for example, is employed as the adhesive resin component 7a. A metal ball made from gold or the like, a resin ball the surface of which is coated with a metal such as gold, or the like is employed as the conductive particle 7b. An anisotropic conductive resin in film form or paste form at room temperature can be employed as the anisotropic conductive resin 7. The film form anisotropic conductive resin 7 at room temperature can be softened once by heat.

Next, in the mounting process of the LED chip 10, the LED chip 10 is placed on the wiring board 41 by the anisotropic conductive resin 7, such that the anode 12, which is the joint surface 14, faces the mounting pad 45R. After the placement, the LED chip 10 is pressed towards the wiring board 41 while the anisotropic conductive resin 7 is heated or irradiated with ultraviolet light. By going through the steps as above, the adhesive resin component 7a is solidified, and the LED chip 10 and the wiring board 41 are joined together. The distance between the anode 12 and the bumps 47 is small, thus the conductive particles 7b lie between the anode 12 and the bumps 47. Therefore, the anode 12 is electrically connected to the bumps 47 on the mounting pad 45R.

Next, in the mounting process of the LED chip 10, the cathode 13 and the connection pad 46 are electrically connected with each other via the wire W by means of a wire bonding method.

In this way as described above, the red LED chip 10 belonging to the first type LED chip 60 can be mounted on the wiring board 41.

In the formation process of the mounting structure concerning the LED chip 10 and the wiring board 41, it is prevented that the anode 12 excessively approaches the mounting pad 45R due to the presence of the bumps 47. As a result, the amount of the anisotropic conductive resin 7 running over between the LED chip 10 and the wiring board 41 is appropriately controlled. Therefore, in the mounting structure to be formed, the area of the place on a side surface of the laminated structure 11 that is covered by the anisotropic conductive resin 7 is small. As above, in this mounting structure, the decrease in luminance of the LED chip 10, which is caused by the fact that the side surfaces of the laminated structure 11 are covered, is appropriately prevented.

Further, in this mounting structure, the anisotropic conductive resin 7 is employed as a means to adhere and fix the LED chip 10 to the wiring board 41. By being pressed, the anisotropic conductive resin 7 produces an electrical conductivity in the pressed area. Therefore, in this mounting structure, even if there is an area on the side surface of the laminated structure 11 that is covered by the anisotropic conductive resin 7, substantially no leak current that runs through this area when applying a voltage to the LED chip 10 is not generated. Consequently, in this mounting structure, the decrease in luminance of the LED chip 10 due to leak current is appropriately prevented.

Figure 7:
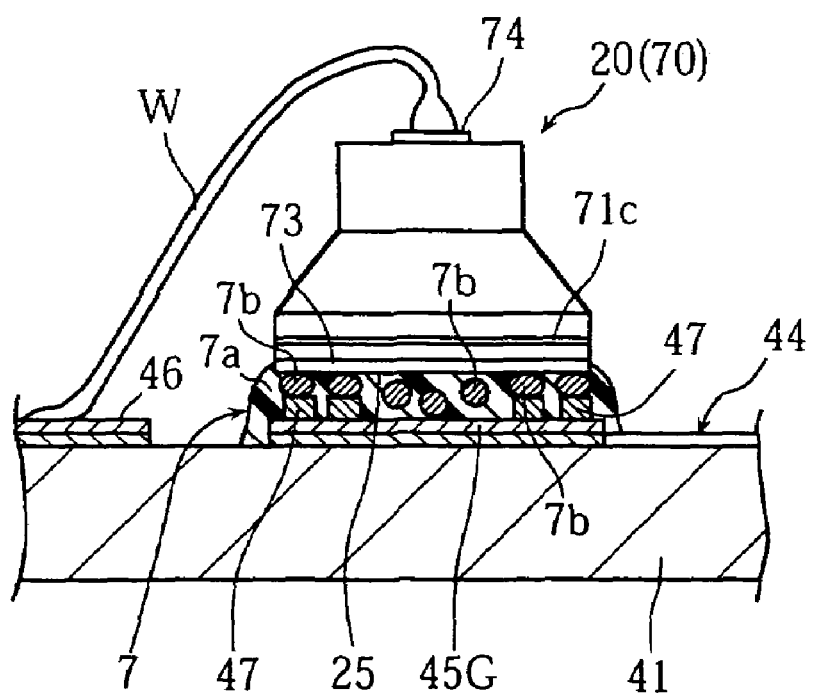
FIG. 7 shows another example of the LED chip mounting structure according to the present invention.

FIG. 7 shows an example of the LED chip mounting structure according to the present invention, the mounting structure being related to the LED chip 20 and the wiring board 41.

In the mounting structure concerning the LED chip 20 and the wiring board 41, the anode 23, which is the joint surface 25 of the LED chip 20, faces the mounting pad 45G, and the LED chip 20 is fixed to the wiring board 41 by the anisotropic conductive resin 7. The distance between the anode 23 and the bumps 47 is small, thus the conductive particles 7b lie between the anode 23 and the bumps 47. The anode 23 is electrically connected to the bumps 47 on the mounting pad 45G by the conductive particles 7b lying between the anode 23 and the bumps 47. The cathode 24 and the connection pad 46 are electrically connected with each other via the wire W.

Such a mounting structure concerning the LED chip 20 and the wiring board 41 can be formed through the formation process of the mounting structure concerning the LED chip 10 and the wiring board 41, and through a substantially similar process.

In the formation process of the mounting structure concerning the LED chip 20 and the wiring board 41, it is prevented that the anode 23 excessively approaches the mounting pad 45G due to the presence of the bumps 47. As a result, the amount of the anisotropic conductive resin 7 running over between the LED chip 20 and the wiring board 41 is appropriately controlled. Therefore, in the mounting structure to be formed, the area of the place on a side surface of the laminated structure 21 that is covered by the anisotropic conductive resin 7 is small. As above, in this mounting structure, the decrease in luminance of the LED chip 20, which is caused by the fact that the side surfaces of the laminated structure 21 area covered, is appropriately prevented.

Further, in this mounting structure, the anisotropic conductive resin 7 is employed as a means to adhere and fix the LED chip 20 to the wiring board 41. By being pressed, the anisotropic conductive resin 7 produces an electrical conductivity in the pressed area. Therefore, in this mounting structure, even if there is an area on the side surface of the laminated structure 21 that is covered by the anisotropic conductive resin 7, substantially no leak current that runs through this area when applying a voltage to the LED chip 20 is not generated. Consequently, in this mounting structure, the decrease in luminance of the LED chip 20 due to leak current is appropriately prevented.

Figure 8A:
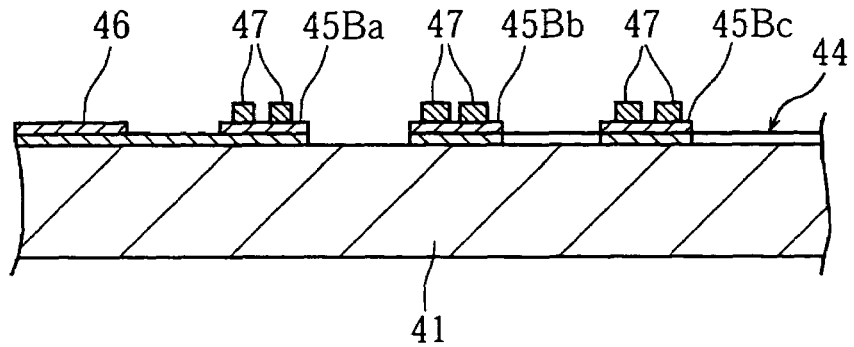
FIG. 8A to FIG. 8C show a formation process of another embodiment of the LED chip mounting structure according to the present invention.
Figure 8B:
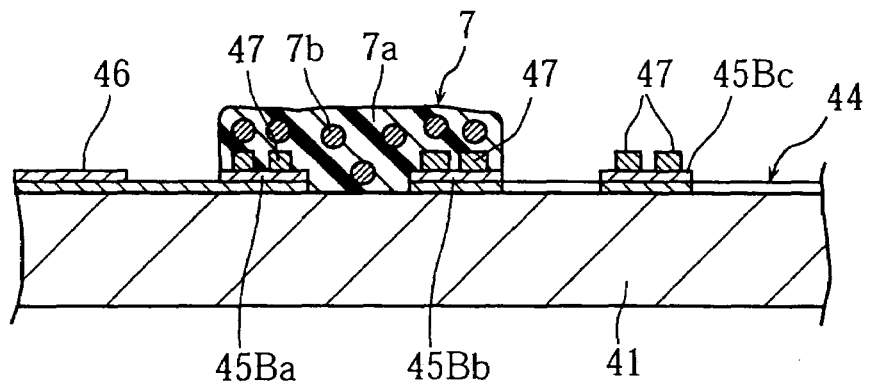
Figure 8C:
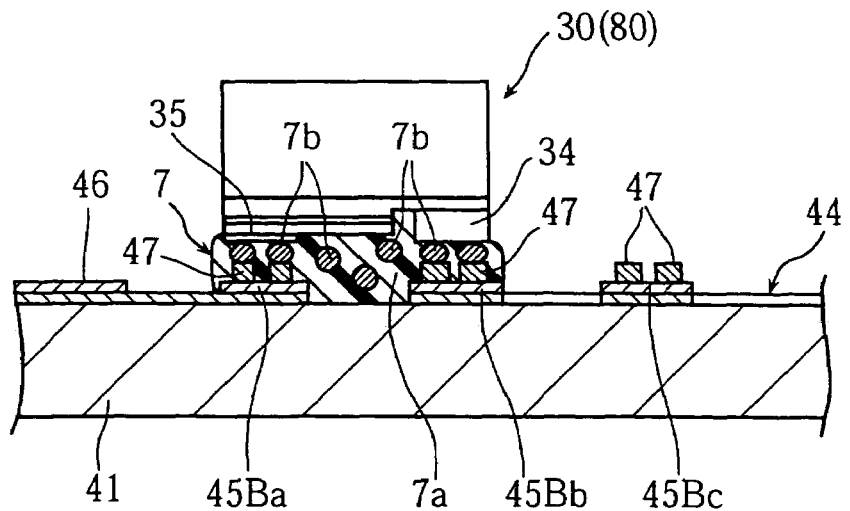

FIG. 8A to FIG. 8C show an example of the formation process of another LED chip mounting structure according to the present invention, the formation process being of the mounting structure concerning the LED chip 30 and the wiring board 41. When mounting the LED chip 30 on the wiring board 41, first of all the wiring board 41 in which the plurality of bumps 47 are already formed is prepared, as shown in FIG. 8A. The plurality of bumps 47 can be formed by the same technique described above regarding the mounting process of the LED chip 10.

Next, as shown in FIG. 8B, the anisotropic conductive resin 7 is fed onto the wiring board 41 so as to cover the mounting pads 45Ba and 45Bb. The same things as those described above in the mounting process of the LED chip 10 can be used as the anisotropic conductive particles 7b.

Next, as shown in FIG. 8C, the LED chip 30 is placed on the wiring board 41 by the anisotropic conductive resin 7, such that the cathode 35 and the anode 34 respectively face the mounting pad 45Ba and the mounting pad 45Bb. After the placement, the LED chip 30 is pressed towards the wiring board 41 while the anisotropic conductive resin 7 is heated and irradiated with ultraviolet light. By going through the steps as above, the adhesive resin component 7a is solidified, and the wiring board 41 and the LED chip 30 are joined together. The distance between the anode 34 or cathode 35 and the bumps 47 is small, thus the conductive particles 7b lie between the a node 34 or cathode 35 and the bumps 47. Consequently, the cathode 35 is electrically connected to the bumps 47 on the mounting pad 45Ba, and the anode 34 to the bumps 47 on the mounting pad 45Bb. Since the conductive particles 7b do not stick together between the anode 34 and the cathode 35, the insulation between the anode 34 and the cathode 35 is secured. In this way as described above, the blue LED chip 30 belonging to the third type LED chip 80 can be mounted on the wiring board 41.

In the formation process of the mounting structure concerning the LED chip 30 and the wiring board 41, it is prevented that the cathode 35 and anode 34 excessively approach the mounting pad 45Ba and mounting pad 45Bb due to the presence of the bumps 47. As a result, the amount of the anisotropic conductive resin 7 running over between the LED chip 30 and the wiring board 41 is appropriately controlled. Therefore, in the mounting structure to be formed, the area of the place on a side surface of the laminated structure 31 that is covered by the anisotropic conductive resin 7 is small. As above, in this mounting structure, the decrease in luminance of the LED chip 30, which is caused by the fact that the side surfaces of the laminated structure 31 are covered, is appropriately prevented.

Further, in this mounting structure, the anisotropic conductive resin 7 is employed as a means to adhere and fix the LED chip 30 to the wiring board 41. By being pressed the anisotropic conductive resin 7 produces an electrical conductivity in the pressed area. Therefore, in this mounting structure, even if there is an area on the side surface of the laminated structure 31 that is covered by the anisotropic conductive resin 7, substantially no leak current that runs through this area when applying a voltage to the LED chip 30 is not generated. Consequently, in this mounting structure, the decrease in luminance of the LED chip 30 due to leak current is appropriately prevented.

Figure 9:
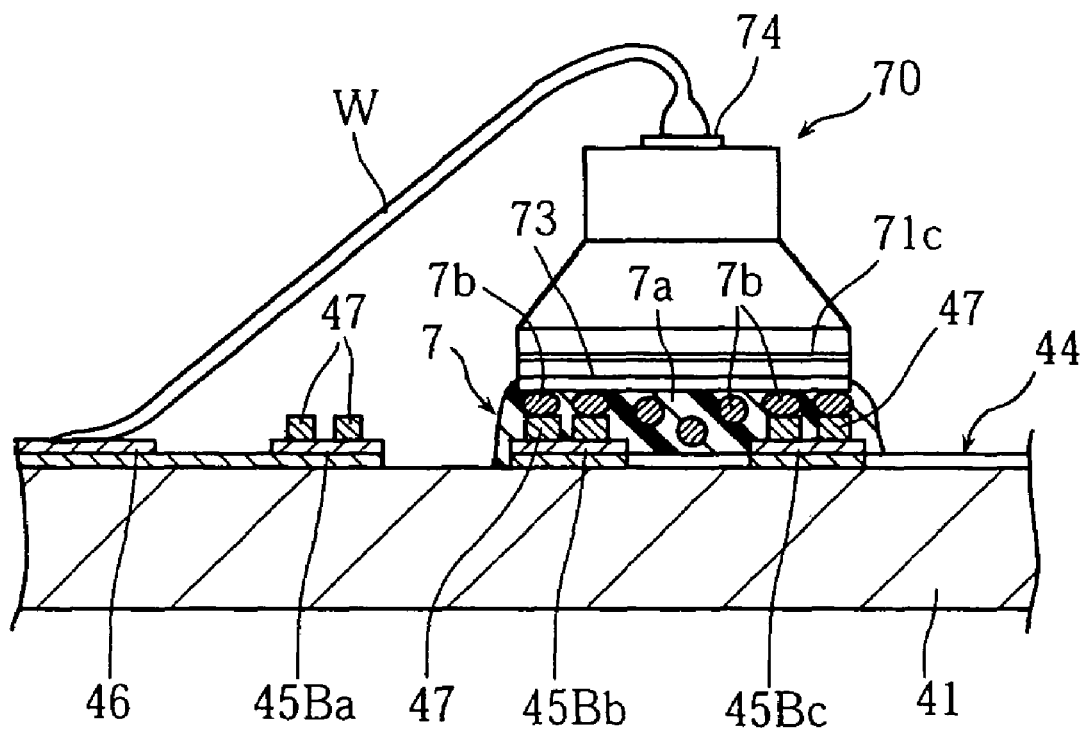
FIG. 9 shows another example of the LED chip mounting structure according to the present invention.
Figure 10A:
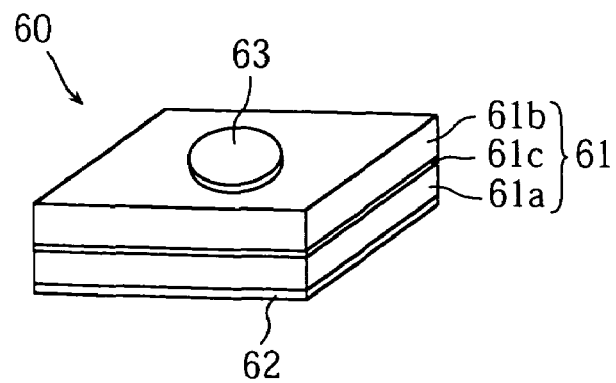
FIG. 10A to FIG. 10C respectively show examples of the LED chip for light source.
Figure 10B:
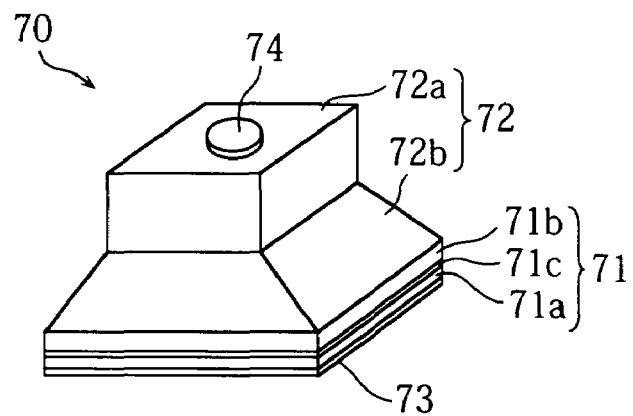
Figure 10C:
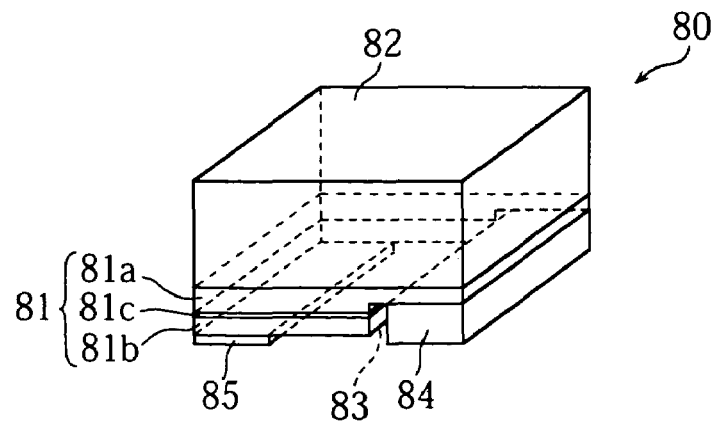
Figure 11:
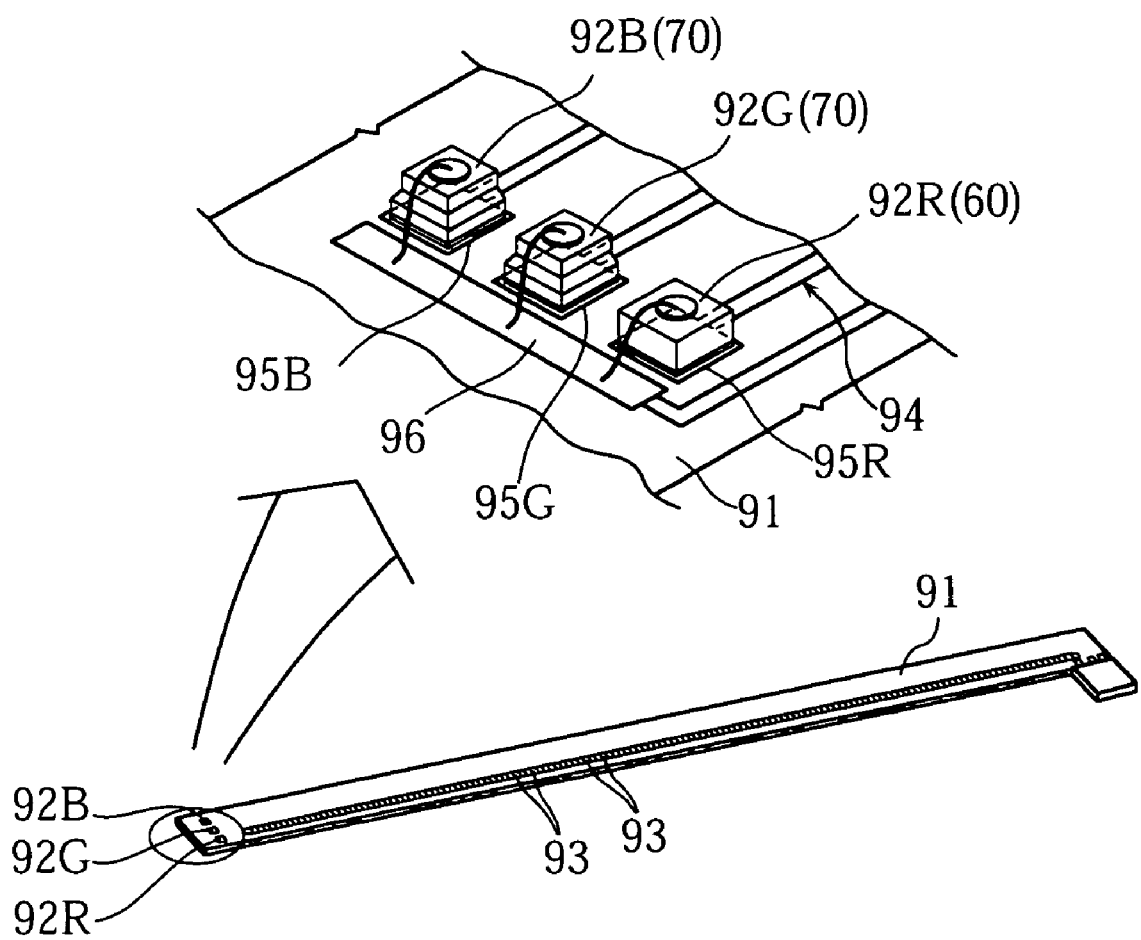
FIG. 11 shows an example of the conventional mounting embodiment of the LED chip for light source for the wiring board in the image reading device.
Figure 12A:
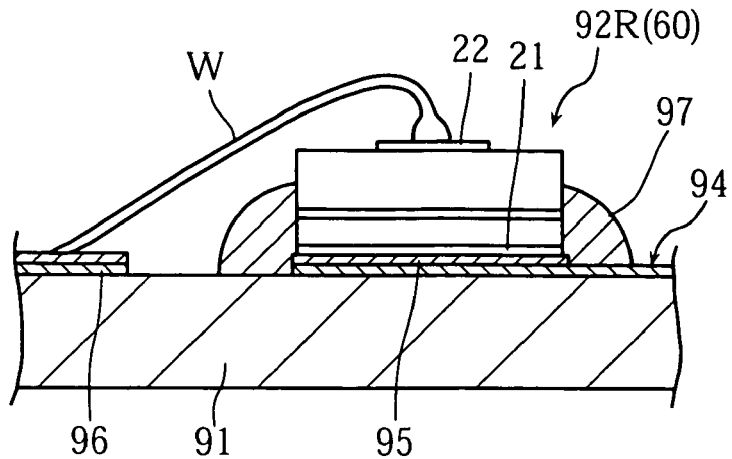
FIG. 12A to FIG. 12C respectively show the conventional LED chip mounting structures.
Figure 12B:
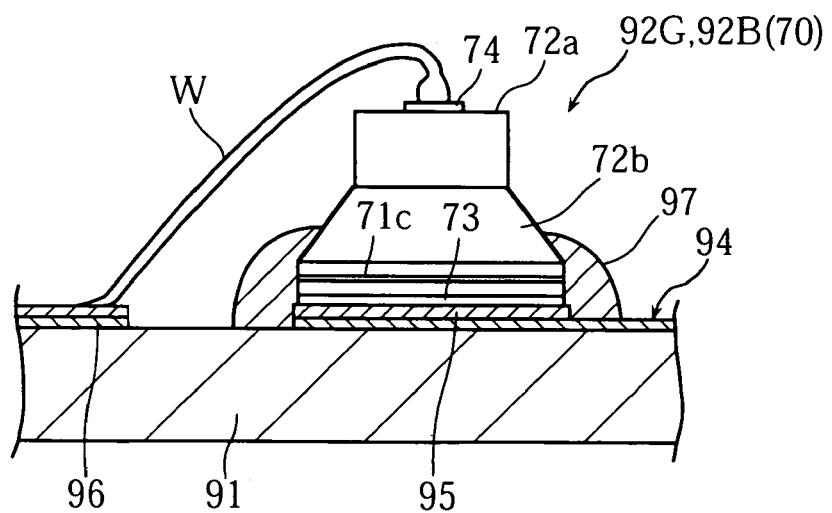
Figure 12C:
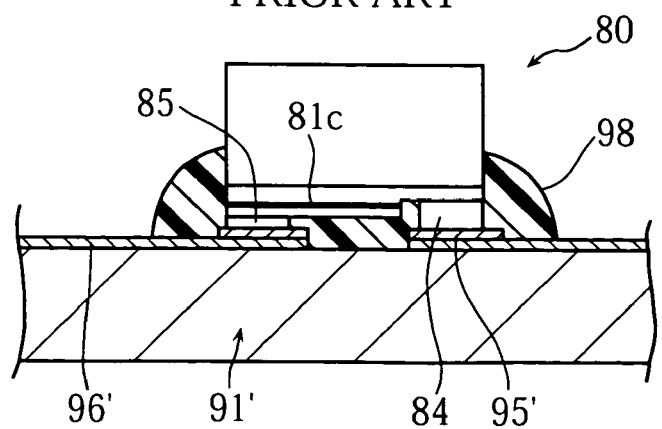

FIG. 9 shows the mounting structure concerning the second type blue LED chip 70 and the wiring board 41 when employing the LED chip 70 as the blue light source, instead of the LED chip 30.

When mounting the LED chip 70 on the wiring board 41, first of all the anisotropic conductive resin 7 is fed onto the wiring board 41 so as to cover the mounting pads 45Bb and 45Bc. The same things as those described above in the mounting process of the LED chip 10 can be used as the anisotropic conductive particles 7b.

Next, the LED chip 70 is placed on the wiring board 41 by the anisotropic conductive resin 7, such that the anode 73 faces the mounting pads 45Bb and 45Bc. After the placement, the LED chip 70 is pressed towards the wiring board 41 while the anisotropic conductive resin 7 is heated or irradiated with ultraviolet light. By going through the steps as above, the adhesive resin component 7a is solidified, and the wiring board 41 and the LED chip 70 are joined together. The distance between the anode 73 and the bumps 47 is small, thus the conductive particles 7b lie between the anode 73 and the bumps 47. The anode 73 is electrically connected to the bumps 47 on the mounting pads 45Bb and 45Bc by the conductive particles 7b lying between the anode 73 and the bumps 47.

Next, in the mounting process of the LED chip 70, the cathode 74 and the connection pad 46 are electrically connected with each other via the wire W by means of the wire bonding method. In this way as described above, the second type blue LED chip 70 can be mounted on the wiring board 41 as the blue light source, instead of the LED chip 30.

In the formation process of the mounting structure concerning the LED chip 70 and the wiring board 41, it is prevented that the anode 73 excessively approaches the mounting pads 45Bb and 45Bc due to the presence of the bumps 47. As a result, the amount of the anisotropic conductive resin 7 running over between the LED chip 70 and the wiring board 41 is appropriately controlled. Therefore, in the mounting structure to be formed, the area of the place on a side surface of the laminated structure 71 that is covered by the anisotropic conductive resin 7 is small. As above, in this mounting structure, the decrease in luminance of the LED chip 70, which is caused by the fact that the side surfaces of the laminated structure 71 are covered, is appropriately prevented.

Further, in this mounting structure, the anisotropic conductive resin 7 is employed as a means to adhere and fix the LED chip 70 to the wiring board 41. By being pressed, the anisotropic conductive resin 7 produces an electrical conductivity in the pressed area. Therefore, in this mounting structure, even if there is an area on the side surface of the laminated structure 71 that is covered by the anisotropic conductive resin 7, substantially no leak current that runs through this area when applying a voltage to the LED chip 70 is not generated. Consequently, in this mounting structure, the decrease in luminance of the LED chip 70 due to leak current is appropriately prevented.

In the production the image reading device X, according to the present invention, when adhering and fixing the group of LED chips 10, 20 and 30 configuring a light source, or when adhering and fixing the group of LED chips 10, 20 and 70 configuring a light source to the wiring board 41, the same technique can be employed for all the LED chips. Therefore, according to the present invention, it is not necessary to employ an adhesion fixation technique in accordance with the configuration of each LED chip, thus it is possible to prevent that the manufacturing steps increase and that the manufacturing line becomes complicated, in the production of the image reading device X.

In the image reading device X, the LED chip 30 belonging to the third type LED chip 80, and the second type blue LED chip 70 also can be used without changing the configuration of the wiring board 41. Therefore, even when the LED chip 30 and the second type blue LED chip 70 are employed together as the blue light source in a single manufacturing line of the image reading device X, it is not necessary to prepare a wiring board having the design of the wiring board 91.

Specifically, when mounting the LED chip 30 on the wiring board 41, the mounting pads 45Ba and 45Bb are selected from among the mounting pads 45Ba, 45Bb and 45Bc on the wiring board 41 to perform mounting. When mounting the blue LED chip 70 on the wiring board 41, the mounting pads 45Bb and 45Bc are selected from among the mounting pads 45Ba, 45Bb and 45Bc on the wiring board 41 to perform mounting. In the mounting step of the blue LED chip, therefore, the mounting pad to which the LED chip is to be joined is selected in accordance with the type of the LED chip. Such a configuration is suitable for reducing the management cost or the production cost, in the case where the second type blue LED chip 70 or the LED chip 30 is selectively employed as the blue light source of the image reading device X.

In the present invention, it is sufficient that the first type and second type LED chips 60 and 70 be mounted on the wiring board 41, such that the respective anodes are electrically connected to at least one of the bumps 47 provided on each mounting pad; however, preferably they are mounted such that the peripheral portions of the anodes are disposed on the plurality of bumps 47. In this case, the first type and second type LED chips 60 and 70 are stably supported with respect to the wiring board 41. Therefore, during mounting, for example, it is possible to prevent the space between the anode and the bump 47 from becoming bigger, which is caused by inclination of the LED chip towards the wiring board 41. Thus, the anode and the bump 47 can be electrically connected with each other securely.

Similarly, it is preferred that the third type LED chip 70 be mounted onto the wiring board 41, such that peripheral portions of the anode 34 and cathode 35 are respectively disposed on the plurality of bumps 47.

In the present invention, in each LED chip mounting structure, an insulating adhesive may be employed instead of the anisotropic conductive resin 7, as a means to fix the LED chips 10, 20 and 30 to the wiring board 41. In this case, by solidifying the above insulating adhesive in the state where each electrode (anode and cathode) appropriately abuts on each mounting pad, the LED chips 10, 20 and 30 are joined to the wiring board 41.

The LED chip mounting structure of the present invention is not limited to the LED chip mounting structure concerning the LED chip for light source and wiring board in the image reading device X, and can be implemented in an LED chip mounting structure, such as an LED display or LED lamp in which an LED chip is employed as a light source. When implementing the LED chip mounting structure of the present invention as the LED chip mounting structure in an LED lamp, the abovementioned LED chips 10, 20 and 30 are mounted on a lead instead of on the wiring board 41, the lead being made from a metallic plate, and the bumps 47 are formed on the place in the lead where the chip is loaded.

The invention claimed is:

1. An LED chip mounting structure, comprising:
   a wiring board provided with a mounting pad;
   an LED chip provided with an electrode facing the mounting pad;
   a bump disposed between the mounting pad and the electrode for electrically connecting the mounting pad and the electrode to each other; and
   an adhesive member for fixing the LED chip to the wiring board;
   wherein the adhesive member comprises an anisotropic conductive resin composite, and the bump is fusion-welded to the mounting pad and is electrically connected to the electrode by the anisotropic conductive resin composite.

2. The LED chip mounting structure according to claim 1, wherein the LED chip is further provided with an electrode that is opposite to the wiring board.

3. An LED chip mounting structure, comprising:
   a wiring board provided with a mounting pad;
   an LED chip provided with an electrode facing the mounting pad;
   a bump disposed between the mounting pad and the electrode for electrically connecting the mounting pad and the electrode to each other; and
   an adhesive member for fixing the LED chip to the wiring board;
   wherein the adhesive member comprises an insulating resin composite, and the bump is fusion-welded to the mounting pad and directly abuts on the electrode without having the insulating resin composite therebetween.

4. An LED chip mounting structure, comprising:
   a wiring board provided with a first and a second mounting pads;
   an LED chip provided with a first electrode facing the first mounting pad and with a second electrode facing the second mounting pad;
   a first bump disposed between the first mounting pad and the first electrode for electrically connecting the first mounting pad and the first electrode to each other;
   a second bump disposed between the second mounting pad and the second electrode for electrically connecting the second mounting pad and the second electrode to each other; and
   an adhesive member for fixing the LED chip to the wiring board;
   wherein the adhesive member comprises an anisotropic conductive resin composite, the first bump is fusion-welded to the first mounting pad and is electrically connected to the first electrode by the anisotropic conductive resin composite, and the second bump is fusion-welded to the second mounting pad and is electrically connected to the second electrode by the anisotropic conductive resin composite.

5. An LED chip mounting structure, comprising:
   a wiring board provided with a first and a second mounting pads;
   an LED chip provided with a first electrode facing the first mounting pad and with a second electrode facing the second mounting pad;
   a first bump disposed between the first mounting pad and the first electrode for electrically connecting the first mounting pad and the first electrode to each other;
   a second bump disposed between the second mounting pad and the second electrode for electrically connecting the second mounting pad and the second electrode to each other; and
   an adhesive member for fixing the LED chip to the wiring board;
   wherein the adhesive member comprises an insulating resin composite, the first bump is fusion-welded to the first mounting pad and directly abuts on the first electrode without having the insulating resin composite therebetween, and the second bump is fusion-welded to the second mounting pad and directly abuts on the second electrode without having the insulating resin composite therebetween.

6. An LED chip mounting structure, comprising:
a wiring board provided with at least three mounting pads;
an LED chip provided with an electrode facing first and second mounting pads selected from among said at least three mounting pads;
a first bump disposed between the first mounting pad and the electrode for electrically connecting the first mounting pad and the electrode to each other;
a second bump disposed between the second mounting pad and the electrode for electrically connecting the second mounting pad and the electrode to each other; and
an adhesive member for fixing the LED chip to the wiring board.

7. The LED chip mounting structure according to claim 6, wherein the adhesive member comprises an anisotropic conductive resin composite.

8. The LED chip mounting structure according to claim 7, wherein the first bump is fusion-welded to the first mounting pad and is electrically connected to the electrode by the anisotropic conductive resin composite, and wherein the second bump is fusion-welded to the second mounting pad and is electrically connected to the electrode by the anisotropic conductive resin composite.

9. The LED chip mounting structure according to claim 6, wherein the adhesive member comprises an insulating resin composite.

10. The LED chip mounting structure according to claim 9, wherein the first bump is fusion-welded to the first mounting pad and directly abuts on the electrode without having the insulating resin composite therebetween, and wherein the second bump is fusion-welded to the second mounting pad and directly abuts on the electrode without having the insulating resin composite therebetween.

11. An LED chip mounting structure, comprising:
a wiring board provided with at least three mounting pads;
an LED chip provided with a first electrode facing a first mounting pad selected from among said at least three mounting pads and with a second electrode facing a second mounting pad selected from among said at least three mounting pads;
a first bump disposed between the first mounting pad and the first electrode for electrically connecting the first mounting pad and the first electrode to each other;
a second bump disposed between the second mounting pad and the second electrode for electrically connecting the second mounting pad and the second electrode to each other; and
an adhesive member for fixing the LED chip to the wiring board.

12. The LED chip mounting structure according to claim 11, wherein the adhesive member comprises an anisotropic conductive resin composite.

13. The LED chip mounting structure according to claim 12, wherein the first bump is fusion-welded to the first mounting pad and is electrically connected to the first electrode by the anisotropic conductive resin composite, and wherein the second bump is fusion-welded to the second mounting pad and is electrically connected to the second electrode by the anisotropic conductive resin composite.

14. The LED chip mounting structure according to claim 11, wherein the adhesive member comprises an insulating resin composite.

15. The LED chip mounting structure according to claim 14, wherein the first bump is fusion-welded to the first mounting pad and directly abuts on the first electrode without having the insulating resin composite therebetween, and wherein the second bump is fusion-welded to the second mounting pad and directly abuts on the second electrode without having the insulating resin composite therebetween.

16. An image reading device, comprising:
an LED chip for emitting light to irradiate an image-scanned region of a document;
a wiring board on which the chip is mounted; and
a light receiving portion for receiving light emitted from the LED chip and reflected on the image-scanned region and for outputting an image signal corresponding to an amount of light received;
the wiring board being provided with a mounting pad,
the LED chip being provided with an electrode facing the mounting pad,
a bump being disposed between the mounting pad and the electrode for electrically connecting the mounting pad and the electrode to each other,
the wiring board and the LED chip being fixed to each other by an adhesive member,
the adhesive member comprising an anisotropic conductive resin composite, and
the bump being fusion-welded to the mounting pad and electrically connected to the electrode by the anisotropic conductive resin composite.

17. An image reading device, comprising:
an LED chip for emitting light to irradiate an image-scanned region of a document;
a wiring board on which the chip is mounted; and
a light receiving portion for receiving light emitted from the LED chip and reflected on the image-scanned region and for outputting an image signal corresponding to an amount of light received;
the wiring board being provided with a mounting pad,
the LED chip being provided with an electrode facing the mounting pad,
a bump being disposed between the mounting pad and the electrode for electrically connecting the mounting pad and the electrode to each other,
the wiring board and the LED chip being fixed to each other by an adhesive member,
the adhesive member comprising an insulating resin composite, and
the bump being fusion-welded to the mounting pad and directly abutting on the electrode without having the insulating resin composite therebetween.

* * * * *